United States Patent
Barth et al.

(10) Patent No.: US 9,933,472 B2
(45) Date of Patent: Apr. 3, 2018

(54) METHOD FOR CHECKING A CONNECTION BETWEEN A LOW-VOLTAGE SUPPLY SYSTEM AND A BATTERY, AND MOTOR VEHICLE

(71) Applicant: AUDI AG, Ingolstadt (DE)

(72) Inventors: Karsten Barth, Chemnitz (DE); Rolf Naumann, Michelau (DE); Thomas Hackner, Greding (DE)

(73) Assignee: Audi AG, Ingolstadt (DE)

( * ) Notice: Subject to any disclaimer, the term of this patent is extended or adjusted under 35 U.S.C. 154(b) by 0 days.

(21) Appl. No.: 15/129,803

(22) PCT Filed: Feb. 5, 2015

(86) PCT No.: PCT/EP2015/000224
§ 371 (c)(1),
(2) Date: Sep. 27, 2016

(87) PCT Pub. No.: WO2015/149896
PCT Pub. Date: Oct. 8, 2015

(65) Prior Publication Data
US 2017/0153281 A1  Jun. 1, 2017

(30) Foreign Application Priority Data
Apr. 2, 2014  (DE) .................. 10 2014 004 791

(51) Int. Cl.
*G01R 31/00* (2006.01)
*G01R 31/02* (2006.01)

(52) U.S. Cl.
CPC ......... *G01R 31/006* (2013.01); *G01R 31/026* (2013.01)

(58) Field of Classification Search
CPC .. G01R 31/025; G01R 31/026; G01R 31/006; G01R 31/007; B60L 3/0069
(Continued)

(56) References Cited

U.S. PATENT DOCUMENTS 7,459,914 B2 * 12/2008 Lindsey ............... B60L 3/0023
324/522
7,560,935 B2 * 7/2009 Morimoto ............ B60L 3/0023
324/503
(Continued)

FOREIGN PATENT DOCUMENTS

CN   103118895 A   5/2013
DE   102 29 018 A1  2/2003
(Continued)

OTHER PUBLICATIONS

Khan, F. H., and L. M. Tolbert. "Bi-directional power management and fault tolerant feature in a 5-kW multilevel dc-dc converter with modular architecture." IET Power Electronics 2.5 (2009): 595-604.*

*Primary Examiner* — Jermele M Hollington
*Assistant Examiner* — Christopher McAndrew
(74) *Attorney, Agent, or Firm* — Seed Intellectual Property Law Group LLP

(57) ABSTRACT

A process to check a connection between a battery (2) supplying a low-voltage network (1) of a motor vehicle (12), the voltage of which is less than the voltage of a high-voltage network (6) of the motor vehicle (12), and the low-voltage network (1); wherein a DC voltage converter (5), which is configured for exchanging electrical power between the high-voltage network (6) and the low-voltage network (1), connects the high-voltage network (6) to the low-voltage network (1); wherein a DC voltage converter (5) modulates the output voltage into the low-voltage network at a modulation frequency; wherein the current hereby applied and the voltage hereby applied are measured by the battery (2), and a resistance value is determined and evaluated with respect to at least one connection criterion, accord- (Continued)

Figure 1:
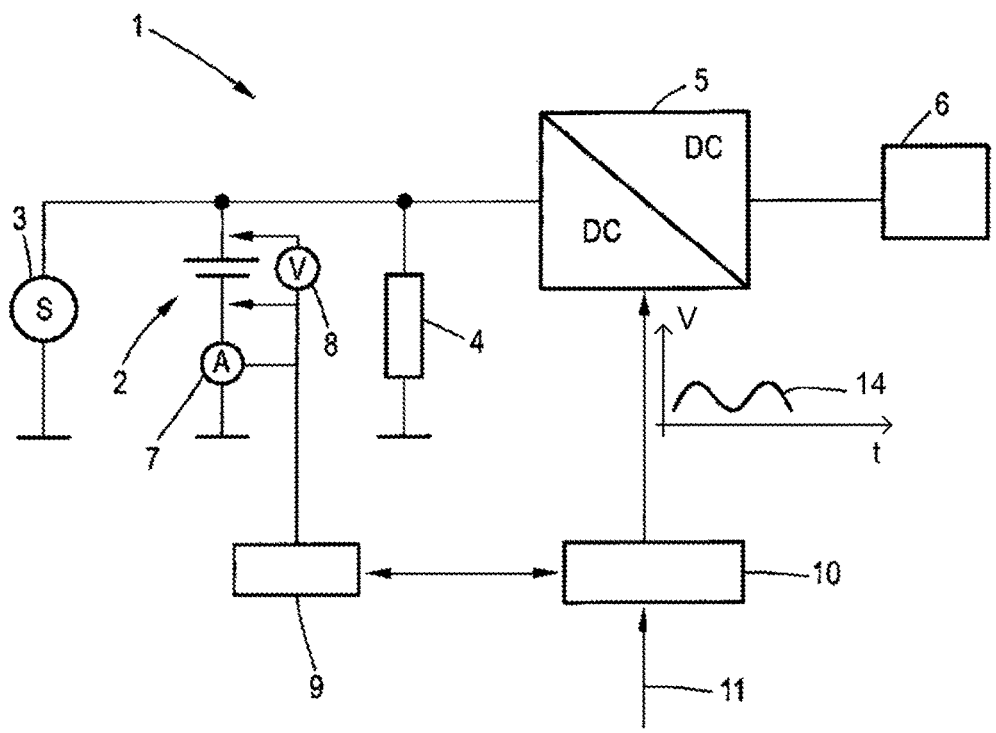

ing to which a connection fault is determined when at least one connection criterion is not fulfilled.

17 Claims, 1 Drawing Sheet

(58) Field of Classification Search
USPC .......................................................... 324/503
See application file for complete search history.

(56) References Cited

U.S. PATENT DOCUMENTS

| | | | |
|---|---|---|---|
| 7,690,453 B2* | 4/2010 | Kinoshita | B60L 11/1868 180/65.1 |
| 8,878,543 B2* | 11/2014 | Morimoto | B60L 3/0069 324/503 |
| 2001/0045840 A1* | 11/2001 | Cirkel | G01R 31/2884 324/750.3 |
| 2007/0222413 A1* | 9/2007 | Kinoshita | B60L 11/1868 320/104 |
| 2008/0197855 A1 | 8/2008 | Uchida | |
| 2012/0280697 A1* | 11/2012 | Morimoto | B60L 3/0069 324/606 |

FOREIGN PATENT DOCUMENTS

| | | |
|---|---|---|
| DE | 102 19 824 A1 | 11/2003 |
| DE | 10 2004 036 042 A1 | 2/2006 |
| DE | 10 2011 087 678 A1 | 6/2013 |
| DE | 10 2013 002 989 A1 | 8/2013 |
| DE | 10 2012 215 755 A1 | 3/2014 |
| EP | 1 361 448 A1 | 11/2003 |
| FR | 2 965 409 A1 | 3/2012 |
| WO | 2013/034249 A2 | 3/2013 |

* cited by examiner

METHOD FOR CHECKING A CONNECTION BETWEEN A LOW-VOLTAGE SUPPLY SYSTEM AND A BATTERY, AND MOTOR VEHICLE

The invention relates to a process to check a connection between a battery supplying a low-voltage network of a motor vehicle, the voltage of which is lower than the voltage of a high-voltage network of the motor vehicle, and the low-voltage network, wherein a DC voltage converter which is configured for exchanging electrical power between the high-voltage network and the low-voltage network connects the high-voltage network to the low-voltage network. In addition, the invention relates to a motor vehicle.

Modern motor vehicles typically have an onboard power supply which is powered by a battery. The voltage level of such type of known onboard power supply is typically around 12 V. In recent times, however, there have been a plurality of applications in which consuming units working at higher voltages are provided, particularly during the use of electric motors as the sole or as an auxiliary drive for the motor vehicle. In this case, typically two electrical networks are provided in the motor vehicle, namely a low-voltage network, which usually runs at the customary voltage of 12 V, and a high-voltage network with a voltage greater than that of the low-voltage network. The voltage of the high-voltage network can, for example, have values greater than 48 V. The high-voltage network and the low-voltage network are often connected through a DC voltage converter (DC/DC converter) in order to enable the exchange of power between the two networks (for example charging the battery of the low-voltage network via the high-voltage network, for example when a generator is connected to the high-voltage network) or in order to support the high-voltage network briefly with power from the low-voltage network. In addition, the supplying of high-powered consuming units of the low-voltage network as well via the high-voltage network is also known.

One fault that can occur in the low-voltage network is a loss of the connection between the low-voltage network and the battery supplying power to it. Such type of fault can occur, for example, as a result of a cable break or the like. Such type of fault is not directly discernible to the driver when a generator directly or indirectly provides the electrical power that is required for operating the consuming units of the low-voltage network. Therefore, what is known as battery-disconnect detection is often implemented in motor vehicles using control units, which is intended to check the connection between the low-voltage network and the battery. In doing so, it is customary to measure the current and the voltage at the battery in order to determine the resistance. Said resistance can then be checked against various connection criteria usually as to whether the resistance has fallen below a threshold value, for example 30 mOhm, and/or whether it is being subjected to fluctuations that are not too extreme, thus, checking if it is remaining essentially stable. Such types of measuring methods are already essentially known in the prior art.

In conventional motor vehicles, often a claw-pole generator is provided which generates a large current and voltage ripple in the 12 V onboard-network, i.e. the low-voltage network. This is important because the current sensor assigned to the battery often cannot measure exactly 0 A or has the greatest uncertainties in the range of small currents. The reason for this may be, for example, a relatively large offset value of the current sensor. In this case, it should further be noted that even with a disconnected battery or otherwise interrupted connection to the low-voltage network, the current sensor can still indicate a current flow as a result of interference caused by voltage fluctuations. For example, if the battery is fully charged and the low-voltage network is being supplied by a different source, for example a generator or the DC voltage converter, the present battery direct current is 0 A. In such a state, a reliable measurement would thus not be possible and no reliable battery-disconnect detection would be possible.

In motor vehicles with a claw-pole generator that is directly connected to the low-voltage network, this is not a problem because the described large current and voltage ripple is given that necessarily impresses larger currents onto the battery. In motor vehicles in which the generator is if need be connected via the DC voltage converter, the described current and voltage ripple is no longer available in the onboard network because the DC voltage converter supplies the consuming units of the low-voltage network in a highly dynamic manner. This means that the battery, for example a 12 V lead battery, is no longer loaded. Thus, the previous method for battery-disconnect detection is reaching its limits.

However, problems occur even in the event of excitation by the generator, because the diagnosis of the connection between the battery and the low-voltage network is not deterministic. It depends on the components of the low-voltage network and its power consumption and power output. In addition, the cabling influences the current ripple. Particularly with respect to the fact that the requirements placed on robustness and reliability of checking the connection between the battery and the low-voltage network are increasing, because increasingly more safety-relevant consuming units need to be powered from the low-voltage network, the current implementation of the battery-disconnect detection must be considered worthy of improvement.

The object of the invention is thus to provide a robust, deterministic process for checking a connection between a battery and a low-voltage network.

To achieve this object, a provision according to the invention with a process of the aforementioned type is that, on the part of a DC voltage converter, a modulation of the output voltage into the low-voltage network takes place at a modulation frequency, wherein the current hereby applied and the voltage hereby applied are measured on the part of the battery and a resistance value is determined and evaluated with respect to at least one connection criterion, according to which a connection fault is determined when at least one connection criterion is not fulfilled.

The finding upon which the invention was based is that typically actively controllable DC voltage converters are used, which thus can be selectively employed in order to impress a defined current on the battery or remove current from the battery. Thus, it is possible to change the battery current through modulation of the output frequency of the DC voltage converter at one or more defined modulation frequencies in order to measure the reaction of the battery to this artificial, selectively applied excitation by means of a current sensor and voltage sensor provided on the battery. In other words, the DC voltage converter is used in order to selectively impress measurement-relevant current onto the battery, which can be reliably sufficiently measured by the current sensor at the battery. In this manner, a deterministic and thus more reliable diagnosis is generated that is not dependent on the consuming units of the low-voltage network. In addition, the invention enables the development of battery-disconnect detection according to a safety standard, for example ASIL-relevant, so that safety-relevant consuming units can be supplied with power from the battery.

As previously mentioned, the active excitation by the DC voltage converter is necessary because it is technically not possible to precisely measure 0 A with the current sensor of the battery. The current measurement by the current sensor is typically configured for a very large current range, for example for currents of −1500 to +1500 A. A measurement of very small currents is thereby burdened with very great measurement inaccuracy. The active excitation by the DC voltage converter then enables sufficiently large currents to be impressed on the battery in order enable a reliable measurement.

In a specific embodiment of the present invention, a provision may be that a check is made as a connection criterion to determine whether the resistance is less than a resistance threshold value, particularly in a range from 25 to 50 mOhm, and/or whether a fluctuation value derived from the chronological progression of the resistance is less than a fluctuation threshold value. For example, a resistance threshold value of 30 mOhm can be used; this means a check is made to determine whether the resistance is in a range from 0 to 30 mOhm. In addition, the resistance should, when the battery is in the low voltage network, be somewhat constant, which can be described by a fluctuation threshold value, for example a standard deviation or the like. If the resistance determined from the measured values is greater than 30 mOhm and a significant fluctuation of the resistance value is present, there is no connection between the battery and the low-voltage network ("battery disconnected").

A provision may be that multiple modulation frequencies are used simultaneously and/or in chronological sequence and/or the modulation is sinusoidal. The superimposing of multiple sinusoidal oscillations enables ultimately any current patterns to be induced in the battery as long as this is reasonable. It has been shown, however, that there is an ideal frequency range for most measurement arrangements of the current sensor and voltage sensor for the measurement; consequently, sinusoidal excitations of a battery current may be particularly useful.

In particular, it has been shown in this context that it is particularly advantageous when the modulation frequency is selected in a frequency band from 50 to 200 Hz, wherein, however, other frequencies including those down to the lower kHz range are also conceivable. Due to the DC voltage converter, a current precisely in this frequency band can be impressed. In this manner, the amplitude of the current ripple can also be reduced, which will reduce the influence on the low-voltage network. For example, a provision may be that the amplitude of the modulation is less than 10% of the absolute voltage of the DC voltage converter.

As previously mentioned, in conventional onboard power supplies the current ripple is generated by the claw-pole generator. Because the frequency of the current ripple depends on the engine speed, there are operating points in which the battery-disconnect detection of the prior art functioned better than in other operating points. By means of the process according to the invention, it is now possible to select frequency bands and/or frequencies in which an ideal operating point for determining the resistance is already indicated, which is why a lower amplitude is also sufficient for enabling a reliable measurement. In addition, certain frequencies can also mean that it is no longer purely the real portion of the battery resistance that is measured, which frequencies, for example, were contained in the not necessarily sinusoidal excitation by the claw-pole generator. Thus, measurement faults could also occur with respect to this that can also be avoided by the process according to the invention, particularly when a sinusoidal modulation is used and the modulation frequency is skillfully selected, particularly in the mentioned range from 50 to 200 Hz.

At this point, it should also be noted that the DC voltage portion of the output voltage of the DC voltage converter can be selected as a function of the charge state of the battery upon an excitation at the modulation frequency. Oftentimes, the voltage of the battery fluctuates with the charge state, slightly at any rate, so that the voltage level can be selected as a function of the charge state of the battery such that a useful, measurable current is safely impressed on the battery. Methods for measuring the charge state of a battery are already known in the prior art and can also be used within the scope of the present invention. The modulation of the output voltage of the DC voltage converter either means that the battery is charged, is discharged, or that the average current value remains the same. It should be noted that the base load in a motor vehicle is usually at least 10 A, which means that, with a fully charged battery, it is possible to discharge the battery with at least 10 A.

Another variable that can influence the amplitude of the output voltage of the DC voltage converter, in addition to the charge state of the battery, is furthermore the impedance of the low-voltage network. Typically, it is generally said that the output voltage of the DC voltage converter is comparable or less than that of a claw-pole generator in conventional motor vehicles. As previously mentioned, the amplitude of the modulation itself may be, for example, 10% or less of the DC voltage portion of the output voltage, such that, for example, a voltage variation between 12.6 and 15 V is possible.

The check can take place cyclically or continuously or be triggered based on a triggering event. Thus, it is possible to check the connection between the battery and the low-voltage network cyclically, i.e. in set time intervals. It may also be appropriate, however, to enable a continuous check to take place, for example by means of the continuous presence of excitation. In order to keep the network load as low as possible, however, it is appropriate to trigger the check based on a triggering event, which can take place, for example, starting from a control unit responsible for power management in the motor vehicle.

In doing so, a starting of the motor vehicle and/or the detection of a critical operating situation of the low-voltage network can be used as the triggering event. This may also include start/stop processes when a vehicle system implementing a start/stop function is present. It is especially suitable, however, to provide critical operating situations for the low-voltage network, particularly critical driving situations, as a trigger for checking the connection between the battery and the low-voltage network. In doing so, a particular provision may be that a critical operating situation is detected at least when at least one predetermined, particularly safety-relevant consuming unit can no longer be supplied solely by the DC voltage converter from the high-voltage network. For example, if the heating system of the motor vehicle requires a high quantity of electric power from the DC voltage converter, but electric power is also required for steering the motor vehicle, then a critical vehicle state is present because the battery has to contribute electrical power.

Appropriately, in the event that a connection fault has been detected, a corresponding information can be generated and output to the driver of the motor vehicle. Once an increased reliability in the battery-disconnect detection is present due to the process according to the invention, it is then possible to indicate a connection fault directly to the driver because the risk of a false alarm is significantly reduced.

An advantageous further embodiment of the present invention is that a resistance measurement also be conducted on the DC voltage converter and that its connection to the low-voltage network be checked. In this manner, it is also possible to determine whether the DC voltage converter is still connected to the low-voltage network, since, of course, current has to be generated at the DC voltage converter from the current produced in the battery. In this manner, a check can thus be made to determine whether the active excitation by the DC voltage converter is even reaching the battery.

It is also especially advantageous when the process according to the invention is developed with consideration of at least one safety standard, particularly the ASIL Standard (ISO 26262). In particular, at least one computer program used to implement the process according to the invention can satisfy at least one safety standard, particularly the ASIL Standard.

In addition to the process, the invention also relates to a motor vehicle comprising a low-voltage network; a high-voltage network, the voltage of which is greater than that of the low-voltage network; a battery supplying the low-voltage network; a DC voltage converter connecting the high-voltage network with the low-voltage network, which is configured to exchange electrical power between the high-voltage network and the low-voltage network; and at least one control unit which is configured to execute the process according to the invention. In doing so, it is conceivable that the functions of the process according to the invention will be divided up into two or more control units, wherein the use of a central power management control unit may also be suitable. All of the statements with respect to the process according to the invention can similarly be made about the motor vehicle according to the invention such that the previously mentioned advantages can also be obtained with it.

In a specific embodiment, a power management control unit and a battery control unit for example may be provided, wherein the battery control unit takes over the reading of the current sensor and of the voltage sensor of the battery and can check against the connection criteria. For example, a trigger signal can be received by the power management control unit, whereupon it activates the actively controllable DC voltage converter with a certain, desirable voltage pattern, optionally depending on the charge state obtained by the battery control unit. The battery control unit, which obtains a corresponding information from the power management control unit, can carry out the measurement and optionally forward the result to the power management control unit.

Figure 2:
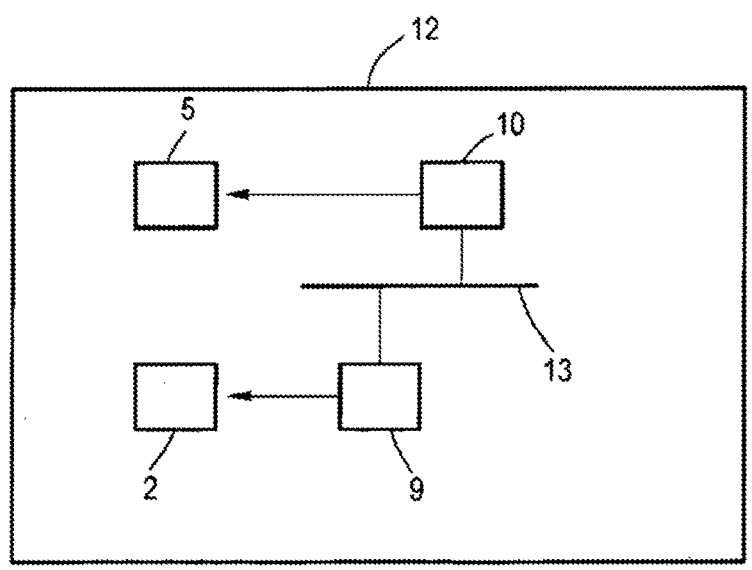

Additional advantages and individual details of the present invention result from the exemplary embodiments described in the following, as well as the drawing. The following is shown:

FIG. 1 a schematic diagram regarding the wiring in the motor vehicle according to the invention, and FIG. 2 a motor vehicle according to the invention.

FIG. 1 shows, in the form of a rough schematic diagram, the wiring in the networks in a motor vehicle according to the invention as well as the functional interaction used in the process according to the invention. In doing so, initially a low-voltage network 1 is provided, which in this case has a voltage of 12 V. The low-voltage network 1 is powered by a battery 2, which in this case is a lead acid battery. Schematically shown as consuming units in the low-voltage network 1 are a starter 3 and an additional consuming unit 4.

The low-voltage network 1 is connected to a high-voltage network 6 via a DC voltage converter 5, which is only shown schematically here, the voltage of the high-voltage network being higher than that of the low-voltage network. Power is exchanged between the low-voltage network 1 and the high-voltage network 6 via the DC voltage converter 5.

A current sensor 7 and a voltage sensor 8 which are read by a battery control unit 9 are provided on the battery 2. In this case, the current sensor 7 is configured for the measurement in a very large range and can thus measure low currents in a range of 0 A only extremely imprecisely, also due to a possibly present offset.

The battery control unit 9, however, is configured to determine a resistance from the current and the voltage, as measured by the sensors 7, 8, and to check against connection criteria that indicate whether the battery 2 continues to be connected to the low-voltage network 1. In the present case, a check is made within this scope to determine whether the resistance is less than a resistance threshold value, which is 30 mOhm here, and whether a fluctuation value describing the fluctuations of the resistance over time is less than a fluctuation threshold value. Based on the described properties of the current sensor 7, this measurement is only reliably possible when there is a greater current from the battery or into the battery.

This current can presently be selectively impressed on the battery 7 once the battery control unit 9 and an additionally provided power management control unit 10 are configured to execute the process according to the invention.

To this end, presently a trigger signal according to arrow 11 indicating a triggering event is transmitted to the power management control unit 10. The triggering event may indicate a starting of the motor vehicle or a critical operating situation in the low-voltage network 1, for example that a particular safety-relevant consuming unit 4 in the low-voltage network 1 can no longer be supplied with power solely from the DC voltage converter 5. Upon the occurrence of such type of triggering event, there should therefore be a check to determine whether there is still a connection between the battery 2 and the low-voltage network 1 (battery-disconnect detection). To this end, the power management control unit 10 controls the DC voltage converter 5 for the modulation of the output voltage of the DC voltage converter 5, wherein an exemplary voltage pattern 14 is symbolically shown. The output voltage consists of a DC voltage portion (which is dependent on the charge state of the battery 2, which is provided to the power management control unit 10 by the battery control unit 9) and the impedance of the low-voltage network, as well as of a modulation of this DC voltage portion, which in this case has at a frequency of 100 Hz sinusoidally.

These voltage fluctuations in the low-voltage network 1 result in the current being impressed on the battery 2, which can be detected by the current sensor 7, while the voltage is simultaneously measured by means of the voltage sensor 8. In other words, the DC voltage converter 5 is actively controlled in order to impress a current on the battery 2, which enables a reliable measurement of the resistance.

The battery control unit 9 will then check to determine whether the resistance is above the resistance threshold value and whether the fluctuation value is above the fluctuation threshold value. If this is the case, the battery 2 is determined to not be connected to the low-voltage network 1, and this information is communicated to the power management control unit 10. This can then, for example, initiate the communication of this information to the driver and/or to other vehicle systems.

Finally, FIG. 2 shows a schematic diagram of a motor vehicle 12 according to the invention, in which the battery 2 and the DC voltage converter 5 as well as the other components shown in FIG. 1 are installed. The battery control unit 9 can communicate with the power management control unit 10 and other vehicle systems via a bus system 13.

Here it should be noted that the functions of the battery control unit 9 and of the power management control unit 10 can obviously also be realized in a single control unit. Furthermore, the control units 9, 10 can also be used for other tasks.

The trigger signal does not necessarily have to be externally routed to the power management control unit 10 but instead can also be determined by this unit itself based on the current utilization of the networks 1, 6. Furthermore, the triggering of the check does not necessarily have to take place based on a triggering event, but rather can also take place in cyclical checks at certain time intervals or even as a continuous monitoring process.

The invention claimed is:

1. A method of checking a connection between a battery supplying a low-voltage network of a motor vehicle, a voltage of which is lower than a voltage of a high-voltage network of the motor vehicle, and the low-voltage network, the method comprising:
    connecting the high-voltage network to the low-voltage network, using a DC voltage converter that is configured for exchanging electrical power between the high-voltage network and the low-voltage network;
    evaluating a resistance value with respect to at least one connection criterion; and
    determining a connection fault when at least one connection criterion is not fulfilled,
    wherein at least one connection criterion is a check of whether a resistance is less than a resistance threshold value, the check based on a triggering event that includes a critical operating situation of the low-voltage network, wherein a critical operating situation is detected at least when at least one predetermined, in particular safety-relevant load can no longer be supplied solely by the DC voltage converter from the high-voltage network.

2. The method according to claim 1, wherein the check is made as a connection criterion to determine whether the resistance is less than a resistance threshold value in a range from 25 to 50 mOhm and/or whether a fluctuation value derived from the chronological progression of the resistance is less than a fluctuation threshold value.

3. The method according to claim 1, wherein multiple modulation frequencies are used simultaneously and/or in chronological sequence, and/or the modulation is sinusoidal.

4. The method according to claim 1, wherein the modulation frequency is selected in a frequency band from 50 to 200 Hz and/or the amplitudes of the modulation are less than 10% of the absolute voltage of the DC voltage portion of the DC voltage converter, and/or the DC voltage portion of the output voltage of the DC voltage converter is selected as a function of the charge state of the battery.

5. The method according to claim 2, wherein the check takes place cyclically or continuously or is triggered based on a triggering event.

6. The method according to claim 5, wherein a starting of the motor vehicle and/or the detection of a critical operating situation of the low-voltage network is used as the triggering event.

7. The method according to claim 1, wherein a corresponding message is generated and output to the driver of the motor vehicle in the event of a determined connection fault.

8. The method according to claim 1, wherein a resistance measurement is also conducted at the DC voltage converter, and its connection to the low-voltage network is checked.

9. A motor vehicle, comprising:
    a low-voltage network;
    a high-voltage network, a voltage of which is greater than a voltage of the low-voltage network;
    a battery supplying the low-voltage network;
    a DC voltage converter connecting the high-voltage network with the low-voltage network, which DC voltage converter is configured to exchange electrical power between the high-voltage network and the low-voltage network; and
    at least one control unit which is configured to execute a process to check a connection between the battery supplying the low-voltage network of the motor vehicle, the voltage of which is lower than the voltage of the high-voltage network of the motor vehicle, and the low-voltage network,
    wherein a DC voltage converter connects the high-voltage network to the low-voltage network, the DC voltage converter modulates an output voltage into the low-voltage network at a modulation frequency, wherein a current hereby applied and a voltage hereby applied are at the battery, a resistance value is determined from a measured voltage and a measured current, and the resistance value is evaluated with respect to at least one connection criterion, according to which a connection fault is determined when at least one connection criterion is not fulfilled,
    wherein the check is triggered based on a triggering event, and wherein a critical operating situation is detected at least when at least one predetermined, in particular safety-relevant load can no longer be supplied solely by the DC voltage converter from the high-voltage network.

10. The motor vehicle of claim 9, wherein a starting of the motor vehicle and/or the detection of a critical operating situation of the low-voltage network is used as the triggering event.

11. A method of checking a connection between a battery supplying a low-voltage network of a motor vehicle, a voltage of which is lower than a voltage of a high-voltage network of the motor vehicle, and the low-voltage network, the method comprising:
    connecting the high-voltage network to the low-voltage network, using a DC voltage converter that is configured for exchanging electrical power between the high-voltage network and the low-voltage network;
    modulating, via the DC voltage converter, an output voltage into the low-voltage network at a modulation frequency;
    wherein a current hereby applied and a voltage hereby applied are at the battery;
    determining a resistance value from a measured voltage and a measured current;
    evaluating the resistance value with respect to at least one connection criterion; and determining a connection fault when at least one connection criterion is not fulfilled, wherein at least one connection criterion is a check of whether a resistance is less than a resistance threshold value, the check based on a triggering event that includes a critical operating situation of the low-voltage network, wherein a critical operating situation is detected at least when at least one predetermined, in particular safety-relevant load can no longer be supplied solely by the DC voltage converter from the high-voltage network.

12. The method according to claim 11, wherein a check is made as a connection criterion to determine whether the resistance is less than a resistance threshold value in a range from 25 to 50 mOhm and/or whether a fluctuation value derived from the chronological progression of the resistance is less than a fluctuation threshold value.

13. The method according to claim 11, wherein multiple modulation frequencies are used simultaneously and/or in chronological sequence, and/or the modulation is sinusoidal.

14. The method according to claim 11, wherein the modulation frequency is selected in a frequency band from 50 to 200 Hz and/or the amplitudes of the modulation are less than 10% of the absolute voltage of the DC voltage portion of the DC voltage converter, and/or the DC voltage portion of the output voltage of the DC voltage converter is selected as a function of the charge state of the battery.

15. The method according to claim 12, wherein the check takes place cyclically or continuously.

16. The method according to claim 11, wherein a corresponding message is generated and output to the driver of the motor vehicle in the event of a determined connection fault.

17. The method according to claim 11, wherein a resistance measurement is also conducted at the DC voltage converter, and its connection to the low-voltage network is checked.

* * * * *